(12) United States Patent
Dixit

(10) Patent No.: US 6,542,834 B1
(45) Date of Patent: Apr. 1, 2003

(54) CAPACITANCE ESTIMATION

(75) Inventor: Charutosh Dixit, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/449,324

(22) Filed: Nov. 24, 1999

(51) Int. Cl.⁷ .............................................. G01R 27/00
(52) U.S. Cl. .............................................. 702/65; 716/5
(58) Field of Search .............................. 702/58, 59, 65, 702/107, 109, 117, 118, 182, 183, 184, 185; 716/1, 4, 5, 9, 10, 13, 15; 703/15

(56) References Cited

U.S. PATENT DOCUMENTS

| | | | | |
|---|---|---|---|---|
| 5,404,310 A | * | 4/1995 | Mitsuhashi | 716/13 |
| 5,557,531 A | * | 9/1996 | Rostoker et al. | 716/1 |
| 5,687,088 A | * | 11/1997 | Tomita | 703/15 |
| 5,896,300 A | * | 4/1999 | Raghavan et al. | 716/10 |
| 5,956,497 A | * | 9/1999 | Ratzel et al. | 716/1 |
| 6,175,947 B1 | * | 1/2001 | Ponnapalli et al. | 716/5 |
| 6,304,998 B1 | * | 10/2001 | Kamiya et al. | 716/4 |
| 6,321,368 B1 | * | 11/2001 | Abe | 716/9 |
| 6,381,730 B1 | * | 4/2002 | Chang et al. | 716/5 |

\* cited by examiner

*Primary Examiner*—Marc S. Hoff
*Assistant Examiner*—Mohamed Charioui
(74) *Attorney, Agent, or Firm*—Mitchell, Silberberg & Knupp LLP

(57) ABSTRACT

Methods for calculating a total capacitance of a metal wire in an integrated circuit is disclosed. In the present invention, a library containing predetermined wiring topologies is created. Each of the wiring topologies has an associated capacitive value. After extracting a layout topology of a segment of the metal wire, the layout topology is used to find and extract one of the predetermined wiring topologies in the library that corresponds to the layout topology. The associated capacitive value for the extracted wiring topology is used to calculate the total capacitance of the metal wire.

33 Claims, 6 Drawing Sheets

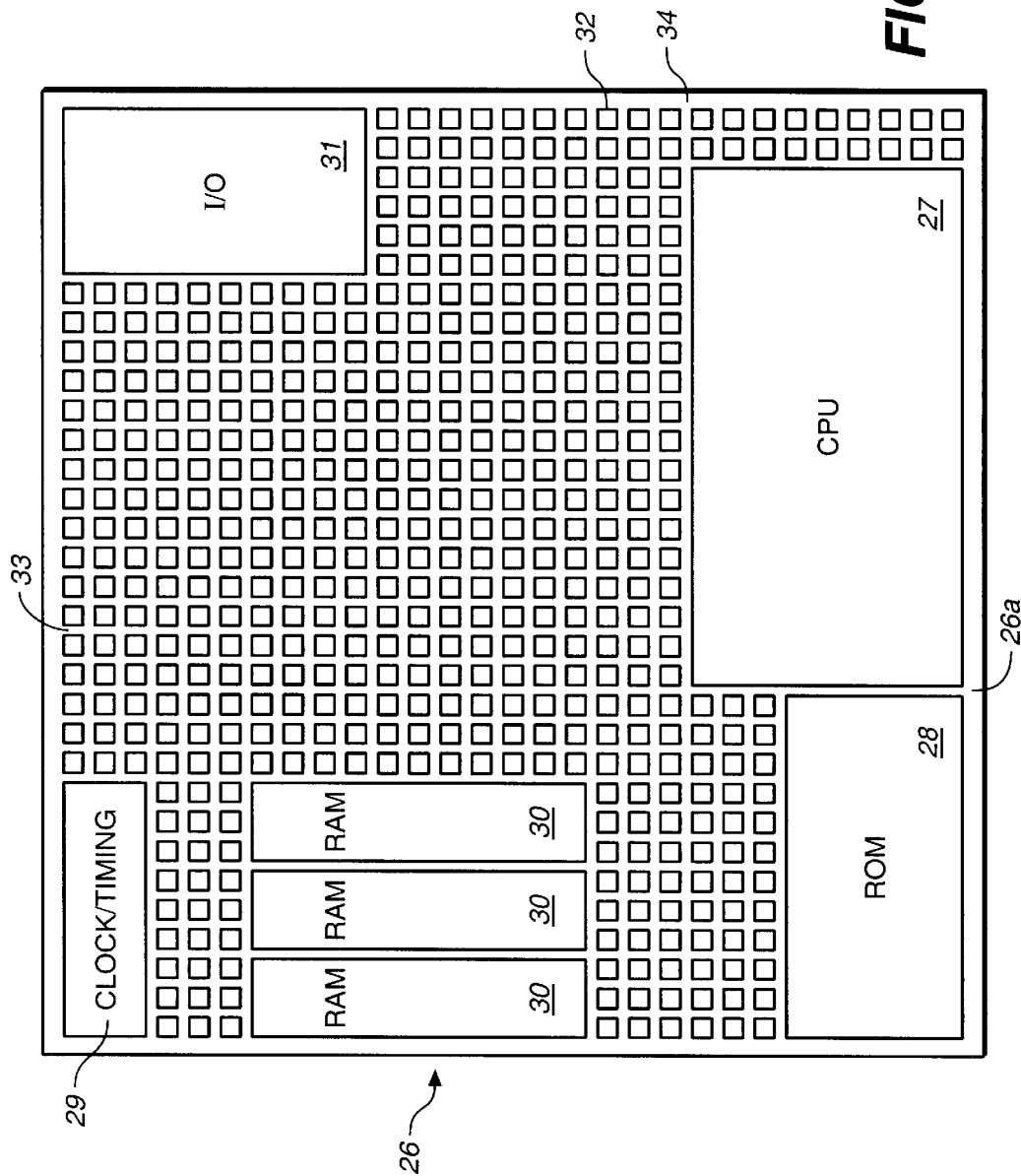
FIG._1

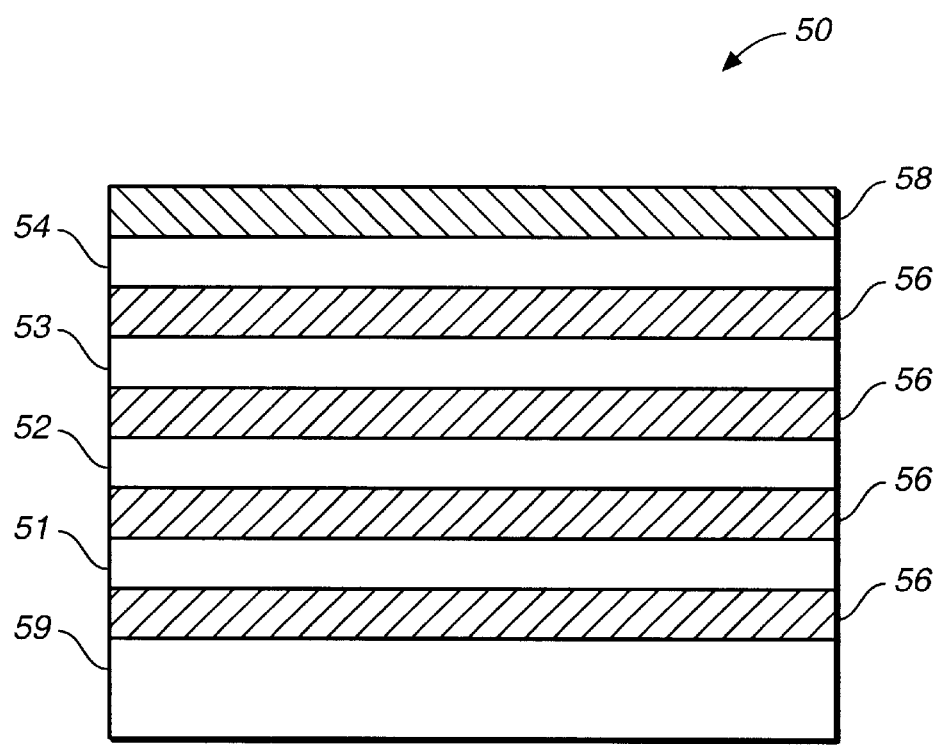
FIG._2

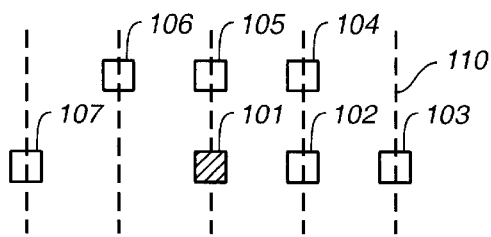
FIG._3
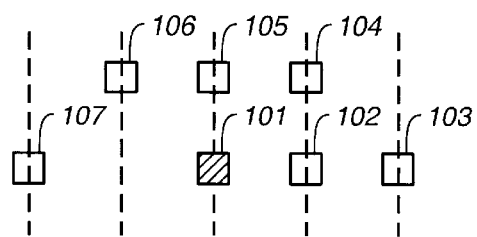
FIG._3A
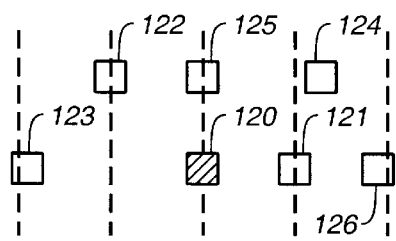
FIG._4
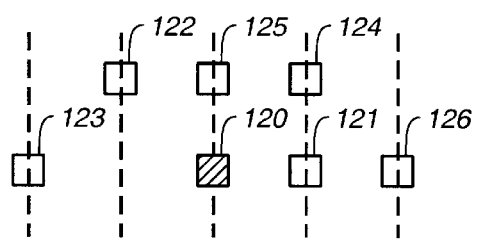
FIG._4A
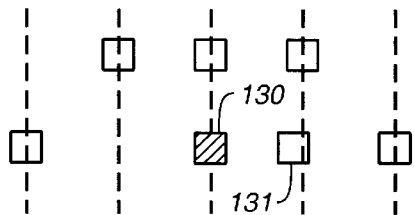
FIG._5
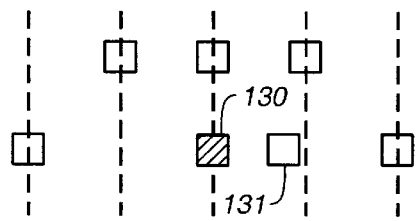
FIG._5A
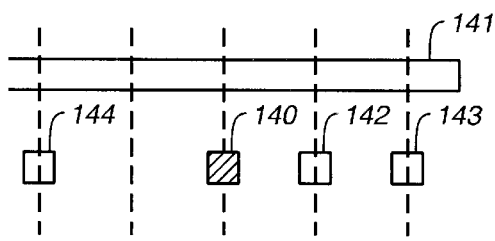
FIG._6
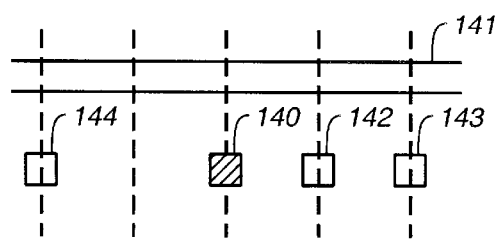
FIG._6A

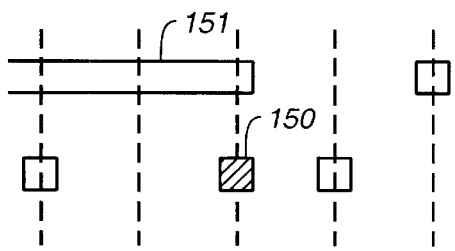
FIG._7
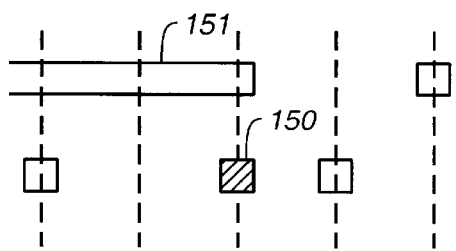
FIG._7A
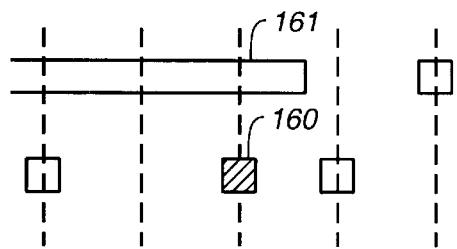
FIG._8
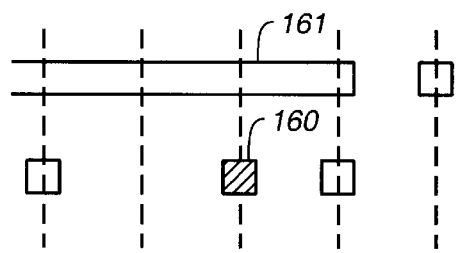
FIG._8A
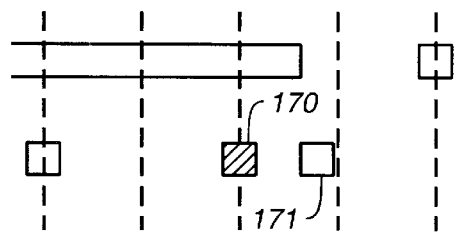
FIG._9
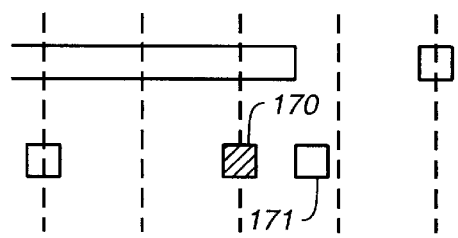
FIG._9A
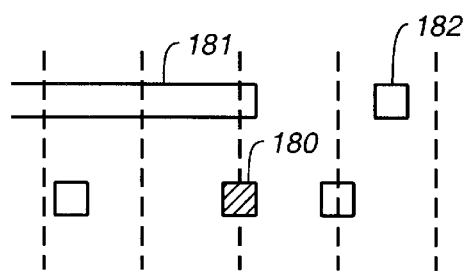
FIG._10
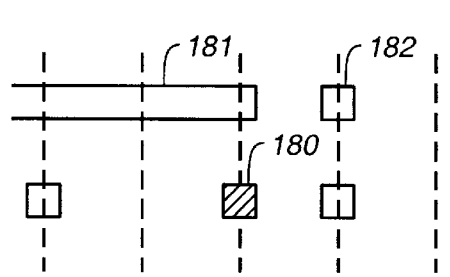
FIG._10A

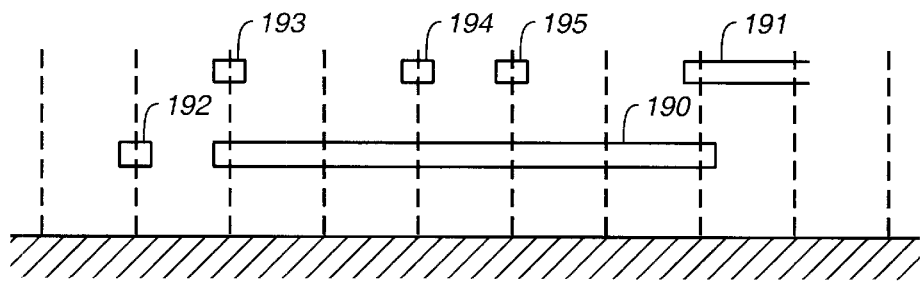
FIG._11
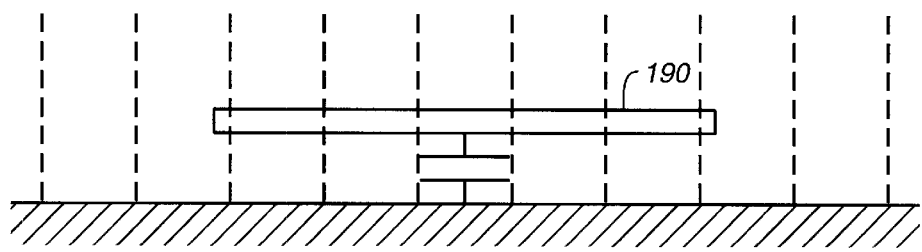
FIG._11A
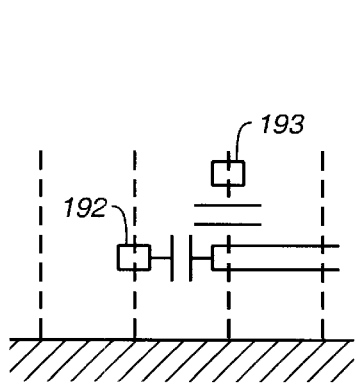 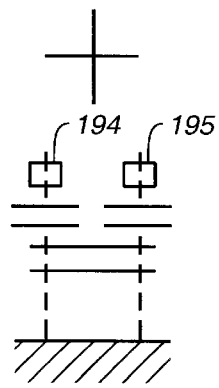 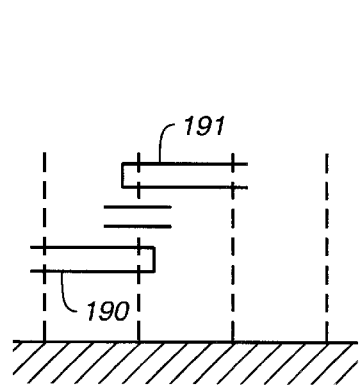
FIG._11B   FIG._11C   FIG._11D

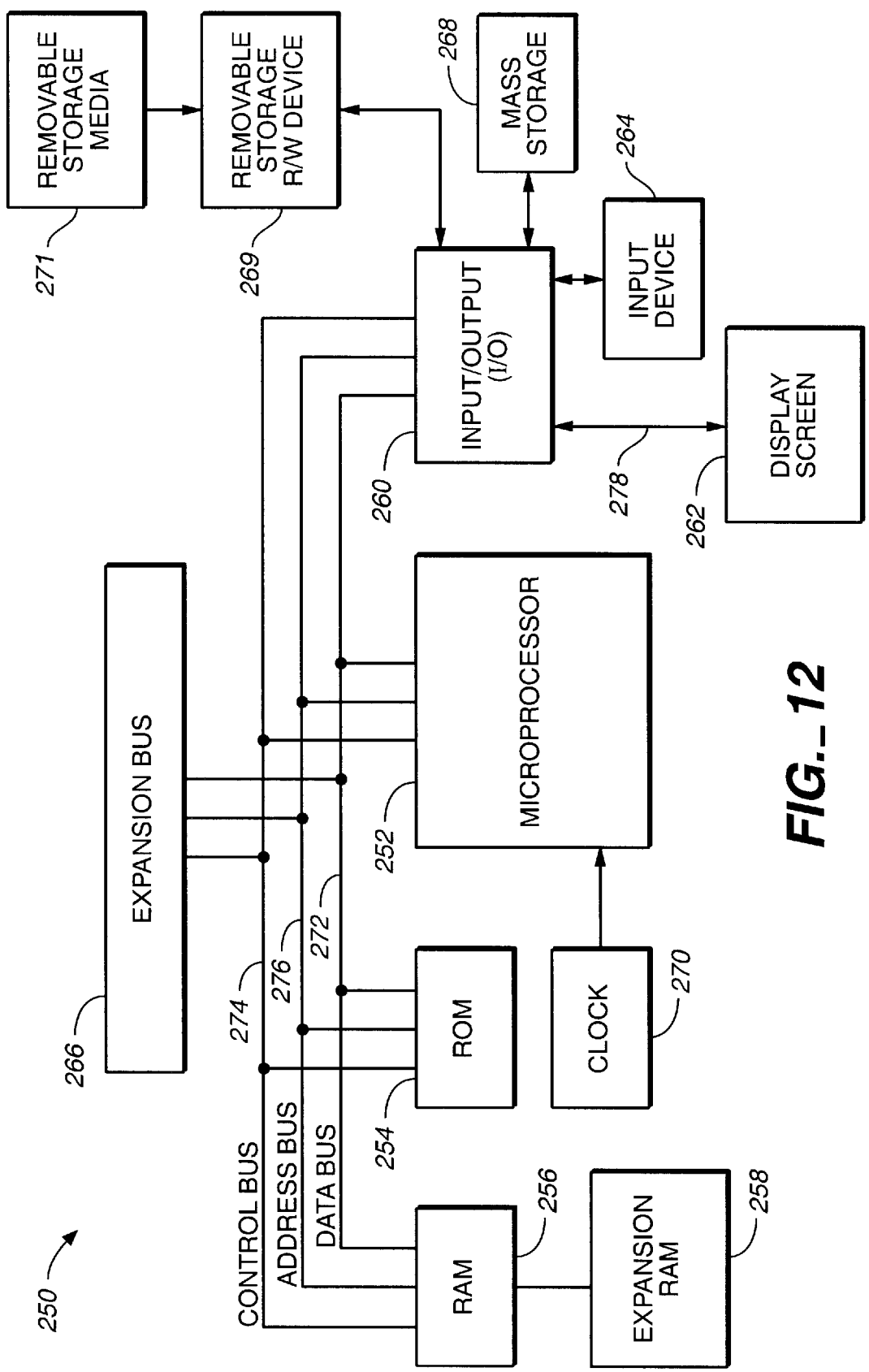
FIG._12

CAPACITANCE ESTIMATION

BACKGROUND OF THE INVENTION

1. Field of the Invention

The present invention generally relates to the art of microelectronic integrated circuits. In particular, the present invention relates to the art of calculating the capacitance of metal wires in integrated circuits.

2. Description of the Prior Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process

The input to the physical design problem is a circuit diagram, and the output is the layout of the circuit. This is accomplished in several stages including partitioning, floor planning, placement, routing and compaction.

1. Partitioning.

A chip may contain several million transistors. Layout of the entire circuit cannot be handled due to the limitation of memory space as well as the computation power available. Therefore, the layout is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor Planning and Placement.

This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

3. Routing.

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

The floor space on ASICs are divided into small areas by grid lines. The grid lines are usually horizontal and vertical lines that divide the floor space on ASICs into small rectangular (usually square) areas. A grid based router usually places circuit elements on the grid lines. In certain cases, a circuit element may be placed off the grid lines.

FIG. 2 provides a simplified cross-sectional view of a typical integrated circuit chip (or die) 50. As shown in FIG. 2, chip 50 includes a semiconductor substrate 59, metal layers 51 to 54, electrically insulating layers 56, and passivation layer 58. Semiconductor substrate 59, which is typically polysilicon, is used for forming the transistors and other electronic devices.

Metal layers 51 to 54 may be formed from any of a variety of materials including aluminum, copper or an electrically conductive alloy. Typically, two to six metal layers are formed on top of substrate 59. Between metal layers 51 and 52, 52 and 53, and 53 and 54, and between metal layers 51 and substrate 59 is an electrically insulating layer 56, which typically is formed as an oxide film. Connections between any of metal layers 51 to 54 and semiconductor substrate 59 are made using interlayer holes called vias. Passivation layer 58 functions to prevent the deterioration of the electrical properties of the die caused by water, ions and other external contaminants, and typically is made of a scratch-resistant material such as silicon nitride and/or silicon dioxide. In a typical circuit, the wires on the metal layer 51 would be orthogonal to the wires on the metal layer 52, the wires on the metal layer 52 would be orthogonal to the wires on the metal layer 53, and the wires on the metal layer 53 would be orthogonal to the wires on the metal layer 54.

Throughout the design process, designers need to know the performance of the final layout. In order to know the final performance, designers need to know the interconnect delays caused by parasitic capacitances such as wiring capacitances caused by metal wires. Basically, accurate and fast capacitance extraction is essential to accurate delay, power and signal integrity calculation. Therefore, ASIC designers need to perform capacitance extraction on the circuit layout to determine the total capacitance and the interconnect delay.

In prior art, designers performed a 2-D or 3-D field solution on the circuit layout to conduct capacitance extraction. Although such field solution test is accurate, 2-D or 3-D field solution tests require much memory and time to conduct. In other instances, designers first formed a large library of patterns and model capacitances based on the geometry of various wires and inter-wire spacings. The designers then performed capacitance extractions on circuit layouts based on the library of patterns and model capacitances. Although such test does not require as much memory or time as the 2-D or 3-D field solution tests, the test requires a library with numerous characterizations and may not produce an accurate result that justifies the effort of building a large library.

SUMMARY OF THE INVENTION

It is an object of the present invention to provide methods for calculating a capacitance of a metal wire in an integrated circuit, which obviate for practical purposes the above mentioned limitations.

According to an embodiment of the present invention, the capacitances of metal wires in IC circuits are calculated by first creating a library containing tables with capacitive values for various predetermined wiring topologies. The library is created by conducting capacitance simulations on various wiring topologies including single-grid on-grid configurations, off-grid configurations and configurations with wide metal lines. Based on the capacitance simulations, each of the predetermined wiring topologies has an associated capacitive value. After creating the library, the preferred embodiments of the present invention calculate the total capacitance of a metal wire by extracting a layout topology of a segment of the metal wire. The extracted layout topology is then converted to a mapped topology based on certain rules. The mapped topology is used to reference the library to find one of the predetermined wiring topologies that matches or corresponds to the mapped topology. The associated capacitive value is then extracted from the corresponding predetermined wiring topology. The extracted capacitive value is then used to calculate a part of the total capacitance of the metal wire. The process is repeated for other segments of the metal wire.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

FIG. 1 is a simplified illustration of an integrated circuit chip on semiconductor material.

FIG. 2 is a simplified illustration of a cross-sectional view of an integrated circuit die which includes four metal layers.

FIGS. 3 and 3a illustrate layout and mapped topologies for a single-grid on-grid configuration, respectively.

FIGS. 4 and 4a illustrate layout and mapped topologies for an off-grid configuration, respectively.

FIGS. 5 and 5a illustrate layout and mapped topologies for another off-grid configuration, respectively.

FIGS. 6 and 6a illustrate layout and mapped topologies for a single-grid configuration with a wide metal line, respectively.

FIGS. 7 and 7a illustrate layout and mapped topologies for another single-grid configuration with a wide metal line, respectively.

FIGS. 8 and 8a illustrate layout and mapped topologies for a single-grid configuration with an off-grid wide metal line, respectively.

FIGS. 9 and 9a illustrate layout and mapped topologies for an off-grid configuration with a wide metal line, respectively.

FIGS. 10 and 10a illustrate layout and mapped topologies for another off-grid configuration with a wide metal line, respectively.

FIGS. 11, 11a, 11b, 11c and 11d illustrate layout and mapped topologies for configurations with multiple wide metal lines.

FIG. 12 is a block diagram of a general-purpose computer system, representing one suitable computer platform for implementing the methods of the invention.

DESCRIPTION OF THE PREFERRED EMBODIMENTS

Accurate and fast capacitance extraction is essential to accurate delay, power and signal integrity calculations which are important in estimating circuit performances. A capacitance extraction methodology needs to consider various different topologies and elements in a circuit. Although it is important to consider as much variations as possible, a capacitance extraction methodology needs to be dynamic and should not consider too many different variations in topology and patterns because by considering too many variations, a large library of patterns and model capacitances is needed, which requires countless numbers of characterizations. The present invention provides dynamic capacitance extraction methodologies that do not require countless numbers of characterization and yet, not sacrifice accuracy.

The following topological elements need to be considered when performing capacitance extractions:

1. The effect of neighboring wires on the same layer and on other layers in the same preferred direction. Wires within a 2 grid radius of each other need to be considered for accuracy.
2. The effect of routing on orthogonal layers. Routing on orthogonal layers can play a significant role for wide metal trunks. Dense routing on the orthogonal layers, or routing over wide orthogonal trunks can also play a significant role.
3. Routing over wide metal trunks such as clock lines and power lines. Wires with wide metal trunk neighbors need to be given special considerations.
4. Off-grid Routing. Wire types which are not increments of grids, and off-grid routing needs to be given special considerations.
5. Floating Conductors In order to perform capacitance extraction, a library containing tables of capacitance per unit length for fixed pre-characterized wiring patterns or configurations first needs to be created. The tables in the library contain capacitance values for various wiring topologies that may be encountered during routing. After creating the library, the library will basically serve as capacitance look-up tables for various wiring topologies. To calculate the capacitance of a particular wire, the wire will be first broken down into sub-segments, and for each sub-segment, the neighboring layout topology will be extracted. Based on the neighboring layout topology, preferred embodiments of the present invention references (or looks-up) the library for a wiring topology that matches the neighboring layout topology and then extracts the capacitance value for the matching topology from the table. The extracted capacitance value represents the capacitance for that particular sub-segment. This process is repeated for each of the sub-segments until the total capacitance value for the wire is calculated.

In preferred embodiments of the present invention, the following basic topologies are considered for capacitance extractions: single grid wires in the neighborhood of other single grid wires in the same or parallel metal layers; single grid wires in the neighborhood of other single grid wires and wide metal wires in the same or parallel metal layers; wide metal wires in the neighborhood of other single grid wires in the same or parallel metal layers.

Specifically, capacitance simulations needs to be performed on the wiring configurations described below to create the library containing the tables of capacitance per unit length values. To be conservative, all neighbors 3 grids away should always be present in the simulations.

For each metal layer, capacitance simulations first need to be performed on all combinations of single-grid on-grid configurations within a radius of 2 grids from the line under test (LUT), i.e., the line for which a capacitance value is being calculated. All configurations with metal layers in the same preferred direction should be considered for the simulations. For example, FIG. 3 illustrates a layout topology for a sample single-grid on-grid configuration. The wires in FIG. 3 are all single grid metal wires that are placed squarely on grids lines 110, i.e., centered on the grid lines 110. In FIG. 3, a metal wire 101 is the line under test (LUT). For the wire 101, all neighboring wires within a radius of 2 grids (wires 102–107) are considered for the capacitance calculation. Capacitance simulation will be performed on other single-grid on-grid configurations.

After performing capacitance simulations on all combinations of single-grid on-grid configurations, simulations need to be performed on off-grid routing patterns. In off-grid routing patterns, certain wires are not placed squarely on the grids lines, but placed off the grids lines. For example, FIG. 4 illustrates a layout topology for a sample off-grid configuration. In FIG. 4, a wire 120 is the LUT, wires 121, 122 and 125 are on-grid wires, and wires 123, 124 and 126 are off-grid wires. The following approaches can be taken to address off-grid wires.

1. Snap off-grid routing patterns to grid. In other words, place off-grid wires on to nearest grid lines, and treat the off-grid wires as on-grid wires. FIG. 4a illustrates this approach. The off-grid wires 123, 124 and 126 are moved on to the nearest grid lines. This approach will not require additional patterns to be characterized since simulations have already been performed for all on-grid configurations. However, this approach will affect accuracy, and can be considered aggressive in some cases.

2. Map an off-grid pattern to a more conservative pre-characterized pattern by moving off-grid wires to a position that is at the minimum allowable spacing from the LUT. For example, in FIG. 5, a wire 131 is an off-grid wire and a wire 130 is the LUT. In FIG. 5a, the wire 131 has been moved to a position that is at a minimum allowable spacing from the LUT wire 130. This approach is a conservative approach since moving the off-grid wire to a minimum allowable spacing will increase the capacitance for the LUT. Capacitance simulations need to be performed on these new topologies in which off-grid wires are moved to the minimum allowable spacing from the LUT to create the tables in the library. For example, if a topology that matches the topology in FIG. 5 is found in the layout, the capacitance value for the topology in FIG. 5a is referenced in the library to calculate the capacitance for the LUT.

3. Use linearized models for capacitance variation as a function of position of neighbor. In this approach, simulations are performed by calculating the capacitance for the LUT by moving the off-grid wires in an increment of a small distance, e.g., 0.1 grid at a time, from the LUT and performing a capacitance calculation for each of the increments.

After performing a capacitance calculation for each increment, the calculated values are interpolated to figure out the actual capacitance value. For example, a capacitance calculation is performed with the off-grid wire 0.1 grid from the LUT, then 0.2 grid from the LUT, and so on. The calculated values are then interpolated to figure out the actual capacitance. This model will give the rate of change of total capacitance for the LUT, when a neighboring wire is displaced from its position (sliding conductor model).

Off-grid routing usually occurs in stub-routed nets, where wire lengths are very short, wire capacitances are in the same order as gate capacitances, and cell delays dominate interconnect delays which are negligible. Thus, a conservative approach is appropriate in this case without leading to much inaccuracy in delay calculations.

The next configurations that need to be simulated for the library are all possible combinations of single-grid on-grid configurations within a 2-grid radius of the LUT when each of other metal layers is considered as a continuous ground plane. FIG. 6a illustrates this approach. In FIG. 6a, a wire 140 is the LUT and a metal layer 141 is considered as a continuous ground plane. Wires 142–144 are metal wires in the same layer as the wire 140. For these configurations, the total capacitance for the LUT as well as the coupling capacitance between the LUT and each metal plane needs to be calculated.

The next configurations for the library are all possible combinations of off-grid configurations within a 2-grid radius of the LUT when each of other metal layers is considered as a continuous ground plane. In these configurations, off-grid configurations are either over or under a wide metal plane. Neighboring wires on the same metal layer can be at the minimum allowable spacing from the LUT to 2 grids away. Lines on other metal layers have to be aligned to grid lines. For these configurations, the total capacitance for the LUT as well as the coupling capacitance between the LUT and each metal plane need to be calculated.

Another configurations that need to be simulated for the library are all possible combinations of single-grid on-grid wires with wide metal lines (e.g., power trunk lines or clock lines). In these simulations, the wide metal lines will be simulated as semi-infinite planes. FIG. 7 illustrates this approach. In FIG. 7, a wire 150 is the LUT, and a wire 151 is a wide metal line that will be treated as a semi-infinite plane during the simulation. The LUT can be located up to 2 grids from the edge of any plane in either direction, and any single grid neighbor has to be within a 2 grid window of the LUT. The number of such patterns may be reduced if there are restrictions placed by layout tools on wide metal lines usage. For these configurations, the total capacitance for the LUT as well as the coupling capacitance between the LUT and each metal plane need to be calculated.

The next configurations for the library are off-grid routings around wide metal plane edges. These configurations involve all possible combinations of patterns using single-grid wires and semi-infinite planes in which single-grid wires on the same metal layer as the LUT are 2-grids or less from the LUT (up to the minimum allowable spacing) and the wires on the other metal layers are aligned to the grid lines. The wide metal plane edge and any single-grid wire can be up to 2 grids away from the LUT. The number of such patterns may be reduced if there are restrictions placed by layout tools on wide metal lines usage. For these configurations, the total capacitance for the LUT as well as the coupling capacitance between the LUT and each metal plane need to be calculated.

In addition to single-grid wires, simulations need to be performed for fringe and area capacitances for wide metal trunk lines when other metal layers are considered to be continuous ground plane. These configurations should be simulated without any neighboring wires except the substrate and other metal ground planes. The area capacitance is the slope, while the fringe is the intercept of the plot of total capacitance vs. width for the metal trunk.

Furthermore, simulations may be needed for the following: the capacitance model for each layer to be used as the default for post-floorplan or post-placement estimation; quantification of the effect of process variations (e.g., metal width/thickness variations, Inter Layer Dielectric thickness variations, keyholes, etc.); and via capacitance.

The number of patterns to be characterized may be reduced if closest neighbor model is used (i.e., all neighbors within 1 grid radius) rather than characterizing all 2 grid patterns.

After creating the library containing the tables of capacitance per unit length for fixed precharacterized wiring patterns, designers must access and reference the table to calculate the capacitance per unit length for the LUT.

The following sections explain how the table should be accessed and referenced for capacitance calculation.

For all single-grid on-grid topologies, the library may be accessed for a direct matching pattern, as shown in FIGS. 3 and 3a. FIG. 3 illustrates a sample layout topology of a single-grid on-grid topology that actually appears in the circuit layout. FIG. 3a illustrates the mapped topology in the library that exactly matches the layout topology. The simulated capacitance value for the matching mapped topology is accessed to calculate the capacitance for the LUT.

In single-grid topologies with off-grid wires that are on a different metal layer from the LUT or are on the same layer but more than one grid spacing from the LUT, the off grid wires are snapped to the grid lines. FIG. 4 illustrates a sample of such topology. In such topologies, the off-grid wires are snapped to the grid lines immediately next to the LUT if a spot is open but are snapped to the grid line farther away from the LUT if a spot is not open, as shown on FIG. 4a. In FIG. 4, a wire 120 the LUT, and wires 123, 124 and 126 are the off-grid wires. The off-grid wires 123, 124 and 126 are snapped to the grid lines as explained above and as shown in FIG. 4a to form the mapped topology that will be referenced to access the capacitance value for the layout topology shown in FIG. 4. Afterwards, the table in the library which contains the capacitance value for the mapped topology shown in FIG. 4a is accessed to calculate the capacitance value for the LUT. However, if there is an off-grid wire that is less than one grid from the LUT on the same metal layer, the wire is mapped to a minimum allowable distance from the LUT as shown on FIG. 5a. In FIG. 5, a wire 130 is the LUT and a wire 131 is an off-grid wire. The wire 131 is mapped to a position which is at the minimum allowable distance from the LUT 130, as shown in FIG. 5a, to form the mapped topology for the layout topology shown in FIG. 5.

In single grid topologies with the LUT more than 2-grids from inside the edge of any wide metal trunk line, the wide metal trunk line is considered to be a wide metal plane. FIG. 6 illustrates this situation. In FIG. 6a, the wide metal line is considered to be a wide metal plane when the library is searched for a mapped topology that corresponds to the layout topology shown in FIG. 6. Basically, FIG. 6a is the mapped topology in the library that corresponds to the layout topology in FIG. 6. As shown in FIGS. 6 and 6a, a wide metal line 141 is considered as a wide metal plane when calculating the capacitance of a wire 140 which is the LUT.

However, if the LUT is within 2 grids of the edge of any wide metal trunk line in single on-grid topologies, the wide metal trunk line will considered to be a semi-infinite plane. FIGS. 7 and 7a illustrates this situation. In FIGS. 7 and 7a, a wire 150 is the LUT, and a wire 151 is the wide metal trunk line. The wire 151 is considered as a semi-infinite plane when calculating the capacitance of the wire 150. Thus, if a layout topology has a wide metal trunk line within 2-grids of a single on-grid line, a mapped topology which considers the wide metal trunk lines as a semi-infinite plane is referenced to calculate the total capacitance for the LUT.

In another situation in which the wide metal trunk line is off-grid and the LUT is within 2-grids of the wide metal line, the wide metal trunk line may be either extended or retracted to snap to a grid and a corresponding mapped topology is referenced in the table to calculate the total capacitance for the LUT. FIGS. 8 and 8a illustrates this situation. In FIGS. 8 and 8a, a wire 160 is the LUT, and a wire 161 is an off-grid wide metal trunk line. The wire 161 is extended to snap to a grid line to calculate the capacitance of the wire 160.

A single grid wire that is less than one grid from the LUT may be moved to a place which is at the minimum allowable spacing from the LUT, as shown in FIGS. 9 and 9a. In FIG. 9a, a wire 171, which is at a place less than one grid from a wire 170, is moved to a place which is at the minimum allowable spacing from the LUT 170. Furthermore, an off-grid single-grid wire more than 1 grid spacing from the LUT may be snapped to a grid closest from the LUT or snapped to a grid that is 2-grids away from the LUT if the closer grid is already occupied by another wire, as shown in FIGS. 10 and 10a. As shown in FIGS. 10 and 10a, a wire 182, which is an off-grid wire, is snapped to a grid line closest to the LUT 180. Afterwards, a corresponding mapped topology is referenced in the table to calculate the total capacitance for the LUT.

In addition to calculating the capacitance of single grid wires, designers need to calculate the capacitance of wide metal trunk lines. In calculating the capacitance of a wide metal line, the edges of the wide metal line will be treated as two semi-infinite planes, while the center of the line will be treated as an infinite metal plane. The total capacitance of a wide metal trunk may be approximated as the sum of the capacitance of the trunk in isolation and the coupling capacitances resulting from the each of the neighboring lines of the trunk.

FIG. 11 illustrates a wide metal trunk line 190 with neighboring metal lines, including another wide metal trunk line 191. Wires 192–195 are single grid lines positioned around the LUT 190. As shown in FIG. 11a, the capacitance of the trunk 190 in isolation is first calculated. Afterwards, the coupling capacitances resulting from the neighboring lines 192 and 193 that are at the left edge of the trunk are calculated, as shown in FIG. 11b. The trunk is treated as a semi-infinite plane in the calculation. Then, the coupling capacitances resulting from neighboring lines 194 and 195 that are at the center of the trunk are calculated, as shown in FIG. 11c. The trunk is treated as a infinite metal plane in this case. Finally, the coupling capacitance resulting from two trunks 191 and 190 are calculated, as shown in FIG. 11d. The resulting capacitance values are then added together to approximate the final capacitance value for the trunk.

Generally, the methods described herein with respect to IC design will be practiced with a general purpose computer, either with a single processor or multiple processors. The methods described herein will also be generally implemented in an ECAD system running on a general purpose computer. FIG. 12 is block diagram of a general purpose computer system, representing one of many suitable computer platforms for implementing the methods described above. FIG. 12 shows a general purpose computer system 250 in accordance with the present invention. As shown in FIG. 12, computer system 250 includes a central processing unit (CPU) 252, read-only memory (ROM) 254, random access memory (RAM) 256, expansion RAM 258, input/output (I/O) circuitry 260, display assembly 262, input device 264, and expansion bus 266. Computer system 250 may also optionally include a mass storage unit 268 such as a disk drive unit or nonvolatile memory such as flash memory and a real-time clock 270.

CPU 252 is coupled to ROM 254 by a data bus 272, control bus 274, and address bus 276. ROM 254 contains the basic operating system for the computer system 250. CPU 252 is also connected to RAM 256 by busses 272, 274, and 276. Expansion RAM 258 is optionally coupled to RAM 256 for use by CPU 252. CPU 252 is also coupled to the I/O circuitry 260 by data bus 272, control bus 274, and address bus 276 to permit data transfers with peripheral devices.

I/O circuitry 260 typically includes a number of latches, registers and direct memory access (DMA) controllers. The purpose of I/O circuitry 260 is to provide an interface between CPU 252 and such peripheral devices as display assembly 262, input device 264, and mass storage 268.

Display assembly 262 of computer system 250 is an output device coupled to I/O circuitry 260 by a data bus 278. Display assembly 262 receives data from I/O circuitry 260 via bus 278 and displays that data on a suitable screen.

The screen for display assembly 262 can be a device that uses a cathode-ray tube (CRT), liquid crystal display (LCD), or the like, of the types commercially available from a variety of manufacturers. Input device 264 can be a keyboard, a mouse, a stylus working in cooperation with a position-sensing display, or the like. The aforementioned input devices are available from a variety of vendors and are well known in the art.

Some type of mass storage 268 is generally considered desirable. However, mass storage 268 can be eliminated by providing a sufficient mount of RAM 256 and expansion RAM 258 to store user application programs and data. In that case, RAMs 256 and 258 can optionally be provided with a backup battery to prevent the loss of data even when computer system 250 is turned off. However, it is generally desirable to have some type of long term mass storage 268 such as a commercially available hard disk drive, nonvolatile memory such as flash memory, battery backed RAM, PC-data cards, or the like.

A removable storage read/write device 269 may be coupled to I/O circuitry 260 to read from and to write to a removable storage media 271. Removable storage media 271 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 250 by typing on a keyboard, manipulating a mouse or trackball, or "writing" on a tablet or on position-sensing screen of display assembly 262. CPU 252 then processes the data under control of an operating system and an application program, such as a program to perform steps of the inventive method described above, stored in ROM 254 and/or RAM 256. CPU 252 then typically produces data which is output to the display assembly 262 to produce appropriate images on its screen.

Expansion bus 266 is coupled to data bus 272, control bus 274, and address bus 276. Expansion bus 266 provides extra ports to couple devices such as network interface circuits, modems, display switches, microphones, speakers, etc. to CPU 252. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. A method of calculating a capacitance of a metal wire in an integrated circuit, using a library containing predetermined wiring topologies, each of the predetermined wiring topologies having an associated capacitive value, said method comprising the steps of:
   (a) extracting a layout topology of a segment of the metal wire;
   (b) converting the layout topology to a mapped topology based on a pre-specified rule;
   (c) finding one of the predetermined wiring topologies corresponding to the mapped topology;
   (d) extracting the associated capacitive value of the predetermined wiring topology corresponding to the mapped topology; and
   (e) calculating a capacitance of the metal wire based on the extracted associated capacitive value.

2. The method of claim 1, wherein the predetermined wiring topologies in the library include capacitance simulations of single-grid on-grid configurations.

3. The method of claim 2, wherein the predetermined wiring topologies in the library further include capacitance simulations of off-grid configurations having off-grid wires.

4. The method of claim 3, wherein the off-grid configurations include metal layers considered as continuous ground planes.

5. The method of claim 3, wherein the predetermined wiring topologies in the library further include capacitance simulations of off-grid configurations with wide metal lines.

6. The method of claim 2, wherein the single-grid on-grid configurations include metal layers considered as continuous ground planes.

7. The method of claim 2, wherein the predetermined wiring topologies in the library further include capacitance simulations of single-grid on-grid configurations with wide metal lines.

8. The method of claim 1, wherein step (b) comprises moving all off-grid wires to grid lines.

9. The method of claim 1, wherein step (b) comprises moving all off-grid wires to a minimum allowable distance from a line under test.

10. The method of claim 1, wherein step (b) comprises positioning off-grid wires on grid-lines.

11. The method of claim 1, wherein step (b) further comprises positioning off-grid wires to a minimum allowable distance from a line under test.

12. The method of claim 1, wherein step (b) comprises converting wide metal lines to metal planes.

13. The method of claim 1, wherein said conversion method further comprises converting metal lines to semi-infinite metal planes.

14. The method of claim 1, wherein step (c) comprises referencing the library with the mapped topology to find one of the predetermined wiring topologies matching the mapped topology.

15. An apparatus for calculating a capacitance of a metal wire in an integrated circuit, using a library containing predetermined wiring topologies, each of the predetermined wiring topologies having an associated capacitive value, said apparatus comprising:
   a processor for executing stored program instruction steps; and
   a memory connected to the processor for storing the program instruction steps, wherein the program instruction steps include:
      (a) extracting a layout topology of a segment of the metal wire;
      (b) converting the layout topology to a mapped topology based on a prespecified rule;
      (c) finding one of the predetermined wiring topologies corresponding to the mapped topology;
      (d) extracting the associated capacitive value of the predetermined wiring topology corresponding to the mapped topology; and
      (e) calculating a capacitance of the metal wire based on the extracted associated capacitive value.

16. The apparatus of claim 15, wherein the predetermined wiring topologies in the library include capacitance simulations of single-grid on-grid configurations.

17. The apparatus of claim 16, wherein the predetermined wiring topologies in the library further include capacitance simulations of off-grid configurations having off-grid wires.

18. The apparatus of claim 17, wherein the off-grid configurations include metal layers considered as continuous ground planes.

19. The apparatus of claim 16, wherein the single-grid on-grid configurations include metal layers considered as continuous ground planes.

20. The apparatus of claim 15, wherein step (b) comprises moving all off-grid wires to grid lines.

21. The apparatus of claim 15, wherein step (b) comprises moving all off-grid wires to a minimum allowable distance from a line under test.

22. The apparatus of claim 15, wherein step (c) comprises referencing the library with the mapped topology to find one of the predetermined wiring topologies matching the mapped topology.

23. A method of calculating a capacitance of a metal wire in an integrated circuit, using a library containing predetermined wiring topologies, each of the predetermined wiring topologies having an associated capacitive value, said method comprising the steps of:
   (a) extracting a layout topology of a segment of the metal wire;

(b) converting a wide metal line in the layout topology to at least one of a metal plane and a semi-infinite metal plane;

(c) finding one of the predetermined wiring topologies corresponding to the layout topology;

(d) extracting the associated capacitive value of the predetermined wiring topology corresponding to the layout topology; and (e) calculating a capacitance of the metal wire based on the extracted associated capacitive value.

24. The method of claim 23, wherein the metal wire is a wide metal trunk line.

25. The method of claim 24, wherein if the metal wire is on the same metal layer as the wide metal trunk line, the wide metal trunk line is converted to a semi-infinite plane.

26. The method of claim 25, wherein if the metal wire is on a line at the center of the wide metal trunk line, the wide metal trunk line is converted to an infinite metal plane.

27. The method of claim 25, wherein the total capacitance of the wide metal trunk line is approximated as a sum of a capacitance of the trunk line in isolation and coupling capacitances of the trunk line with neighboring metal lines.

28. The method of claim 23, wherein the predetermined wiring topologies in the library include capacitance simulations of single-grid on-grid configurations.

29. The method of claim 28, wherein the predetermined wiring topologies in the library further include capacitance simulations of off-grid configurations having off-grid wires.

30. An ECAD system for calculating a capacitance of a metal wire in an integrated circuit, using a library containing predetermined wiring topologies, each of the predetermined wiring topologies having an associated capacitive value, said ECAD system comprising:

(a) means for extracting a layout topology of a segment of the metal wire;

(b) means for converting the layout topology to a mapped topology based on a pre-specified rule;

(c) means for finding one of the predetermined wiring topologies corresponding to the mapped topology;

(d) means for extracting the associated capacitive value of the predetermined wiring topology corresponding to the mapped topology; and (e) means for calculating a capacitance of the metal wire based on the extracted associated capacitive value.

31. The ECAD system of claim 30, wherein said means (c) comprises means for referencing the library with the mapped topology to find one of the predetermined wiring topologies matching the mapped topology.

32. The ECAD system of claim 30, wherein said means (b) comprises means for moving all off-grid wires to grid lines.

33. The ECAD system of claim 30, wherein said means (b) comprises means for moving all off-grid wires to a minimum allowable distance from a line under test.

* * * * *